United States Patent
Ehnholm

(10) Patent No.: US 7,701,220 B2
(45) Date of Patent: Apr. 20, 2010

(54) METHODS AND APPARATUSES FOR CONNECTING RECEIVE COILS IN MAGNETIC RESONANCE IMAGING SCANNERS

(75) Inventor: Gosta Ehnholm, Vantaa (FI)

(73) Assignee: Koninklijke Philips Electronics N. V., Eindhoven (NL)

( * ) Notice: Subject to any disclaimer, the term of this patent is extended or adjusted under 35 U.S.C. 154(b) by 394 days.

(21) Appl. No.: 11/720,874

(22) PCT Filed: Dec. 5, 2005

(86) PCT No.: PCT/IB2005/054052

§ 371 (c)(1),
(2), (4) Date: Jun. 5, 2007

(87) PCT Pub. No.: WO2006/075214

PCT Pub. Date: Jul. 20, 2006

(65) Prior Publication Data

US 2009/0230966 A1 Sep. 17, 2009

Related U.S. Application Data

(60) Provisional application No. 60/633,451, filed on Dec. 6, 2004.

(51) Int. Cl.
*G01V 3/00* (2006.01)
(52) U.S. Cl. .................................. 324/322; 324/318
(58) Field of Classification Search ......... 324/300–322; 600/407–435; 445/456.1; 375/347; 370/347
See application file for complete search history.

(56) References Cited

U.S. PATENT DOCUMENTS 4,777,438 A * 10/1988 Holland ....................... 324/309

(Continued)

FOREIGN PATENT DOCUMENTS

EP 0467378 A2 1/1992

(Continued)

OTHER PUBLICATIONS

Park, B-H, et al.; A 1GHz, Low-Phase-Noise CMOS Frequency Synthesizer with Integrated LC VCO for Wireless Communications; 1998; Proc. of IEEE Custom Integrated Circuits Conf.; vol. 20; pp. 567-570.

*Primary Examiner*—Brij B Shrivastav

(57) ABSTRACT

A coils array (40, 40') including a plurality of coils (71, 72, 73) receives magnetic resonance signals from an examination region of a magnetic resonance imaging scanner (10). Each coil has mixing circuitry (74, 75, 76, 80, 81, 82) that frequency-shifts the received magnetic resonance signal to a selected transmission channel frequency. The coils array further includes combining circuitry (90) that combines the frequency-shifted magnetic resonance signals to produce an analog frequency domain multiplexed transmission signal output of the coils array. Receiver electronics (56, 56") receive the analog frequency domain multiplexed transmission signal from the coils array. The receiver electronics include an analog-to-digital converter (164) that digitizes the analog frequency domain multiplexed transmission signal and digital signal processing circuitry (166) that processes the digital frequency domain multiplexed transmission signal to recover digitized signals corresponding to the magnetic resonance signals received by the plurality of coils.

22 Claims, 5 Drawing Sheets

U.S. PATENT DOCUMENTS

Figure 1:
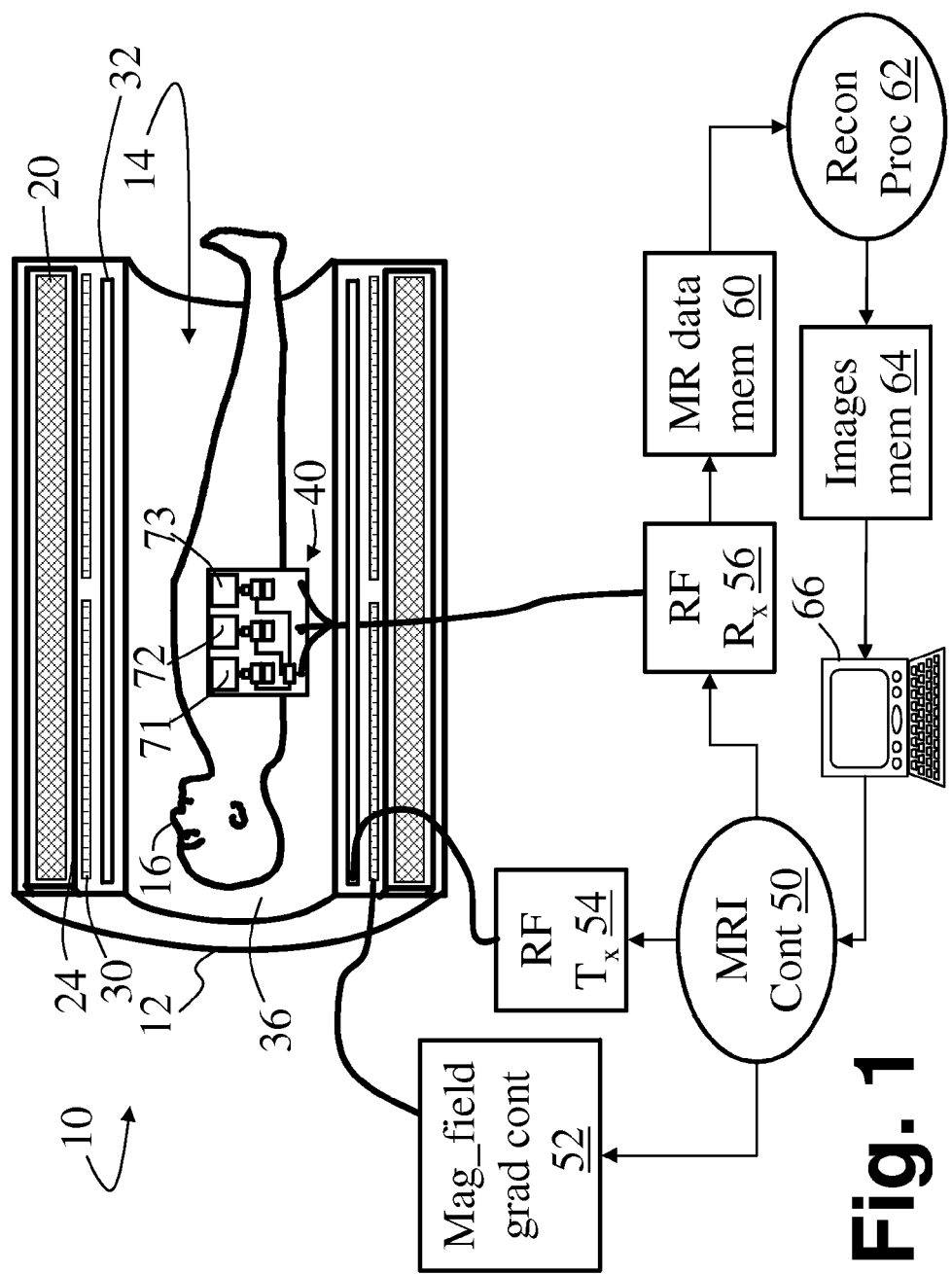

| | | | |
|---|---|---|---|
| 5,245,288 A | 9/1993 | Leussler | |
| 5,384,536 A | 1/1995 | Murakami et al. | |
| 6,624,777 B2 | 9/2003 | Miyano | |
| 6,958,609 B2* | 10/2005 | Raftery et al. | 324/321 |
| 7,133,471 B2* | 11/2006 | Feher | 375/340 |
| 7,280,810 B2* | 10/2007 | Feher | 455/137 |
| 7,323,876 B2* | 1/2008 | Den Boef | 324/322 |
| 7,356,343 B2* | 4/2008 | Feher | 455/456.1 |
| 2003/0076105 A1 | 4/2003 | Feld et al. | |
| 2003/0078004 A1 | 4/2003 | Vester | |
| 2008/0253353 A1* | 10/2008 | Feher | 370/347 |
| 2009/0076803 A1* | 3/2009 | Feher | 704/201 |
| 2009/0096455 A1* | 4/2009 | Biber et al. | 324/322 |
| 2009/0146658 A1* | 6/2009 | McDowell et al. | 324/309 |

FOREIGN PATENT DOCUMENTS

| | | |
|---|---|---|
| EP | 0554584 A1 | 8/1993 |
| JP | 09024036 A | 1/1997 |
| JP | 2002143122 A | 5/2002 |

* cited by examiner

METHODS AND APPARATUSES FOR CONNECTING RECEIVE COILS IN MAGNETIC RESONANCE IMAGING SCANNERS

CROSS REFERENCE TO RELATED APPLICATIONS

This application claims the benefit of U.S. provisional application Ser. No. 60/633,451 filed Dec. 6, 2004, which is incorporated herein by reference.

DESCRIPTION

The following relates to the magnetic resonance arts. It finds particular application in magnetic resonance imaging using multiple receive coils, and will be described with particular reference thereto. More generally, it finds application in magnetic resonance spectroscopy, imaging, and the like.

Magnetic resonance imaging is increasingly employing multiple receive coils during imaging to provide increased data acquisition speed, larger fields of view, and other advantages. Techniques such as parallel imaging, sensitivity encoding (SENSE), and the like use a plurality of coils, such as four coils, eight coils, or so forth. Large coils arrays with thirty-two or more coils are contemplated for use in some of these imaging techniques. The receive coils are placed close to the imaging subject. Each coil has an analog coaxial output conductor, and the coaxial output conductors of the plurality of coils are bundled into a thick cable, which may also include control lines for controlling decouplers or other functions of the receiver coils. The bundled cable becomes thicker and more stiff as more coils are added.

Induced voltages in the cable bundle, which can exceed one hundred volts in some scanners, can lead to cross-talk between the coaxial output conductors, which in turn produces degradation of the resulting reconstructed images. Moreover, suppression of electrical currents in the coaxial output conductors at the magnetic resonance frequency becomes problematic as the number of coaxial output conductors increases. Typically, each coaxial output conductors has its own trap or balun to suppress electrical currents at the resonance frequency.

Feld et al., U.S. Published Application No. 2003/0076105 A1 published on Apr. 24, 2003 disclose an improved approach which addresses some of these problems. Feld et al. disclose frequency domain multiplexing the received magnetic resonance signals at the coils to produce a single analog output which is transmitted to the scanner electronics via a single coaxial output conductor. Each coil includes circuitry for generating the modulating carrier frequency to shift that signal to a selected transmission channel frequency. At the scanner electronics, a bank of demodulators and analog filters separate the transmission channels of the frequency domain multiplexed output, and a corresponding bank of analog-to-digital converters digitize the separate transmission channels to recover the magnetic resonance signals.

The approach of Feld et al. has certain disadvantages. There is substantial duplication of components at the scanner electronics, as each frequency channel includes a dedicated demodulator, analog filter, and analog-to-digital converter. This duplication can become problematic as the number of coils, and hence the number of transmission channels, increases. Moreover, isolated generation of the carrier frequency on each coil, along with the limited accuracy of analog filtering, requires relatively large frequency spacing between the channels to ensure successful channel isolation at the scanner electronics. For example, Feld et al. recommend a frequency spacing of 50-100 MHz. Thus, the frequency domain multiplexed output signal has a large bandwidth. Feld et al. disclose employing dynamic signal compression circuitry on the coil; however, this increases the complexity of the coils assembly and may introduce signal distortion into the compressed signal.

The following contemplates improved apparatuses and methods that overcome the aforementioned limitations and others.

According to one aspect, an apparatus is disclosed for receiving magnetic resonance signals. A coils array includes a plurality of coils adapted to be positioned to receive magnetic resonance signals emanating from an examination region of an associated magnetic resonance imaging scanner. Each coil has corresponding mixing circuitry that frequency-shifts the magnetic resonance signal received by the coil to a selected transmission channel frequency. The coils array further includes combining circuitry that combines the frequency-shifted magnetic resonance signals to produce an analog frequency domain multiplexed transmission signal output of the coils array. Receiver electronics receive the analog frequency domain multiplexed transmission signal from the coils array. The receiver electronics include an analog-to-digital converter that digitizes the analog frequency domain multiplexed transmission signal to produce a corresponding digital frequency domain multiplexed transmission signal, and digital signal processing circuitry that processes the digital frequency domain multiplexed transmission signal to recover digitized signals corresponding to the magnetic resonance signals received by the plurality of coils.

According to another aspect, a magnetic resonance imaging system is disclosed. A main magnet generates a main magnetic field in an examination region. Gradient coils superimpose selected magnetic field gradients on the main magnetic field. A means is provided for injecting radio frequency excitation pulses into the examination region. A coils array includes a plurality of coils that receive magnetic resonance signals emanating from the examination region. Each coil has corresponding mixing circuitry that frequency-shifts the magnetic resonance signal received by the coil to a selected transmission channel frequency. The coils array further includes combining circuitry that combines the frequency-shifted magnetic resonance signals to produce an analog frequency domain multiplexed transmission signal output of the coils array. Receiver electronics receive the analog frequency domain multiplexed transmission signal from the coils array. The receiver electronics include an analog-to-digital converter that digitizes the analog frequency domain multiplexed transmission signal to produce a corresponding digital frequency domain multiplexed transmission signal, and digital signal processing circuitry that processes the digital frequency domain multiplexed transmission signal to recover digitized signals corresponding to the magnetic resonance signals received by the plurality of coils.

According to another aspect, a method is provided for receiving magnetic resonance signals. At a coils array positioned to receive magnetic resonance signals emanating from an examination region of an associated magnetic resonance imaging scanner: (i) magnetic resonance signals are received with a plurality of coils; (ii) the magnetic resonance signal received by each coil is frequency-shifted to a selected transmission channel frequency; and (iii) the magnetic resonance signals frequency-shifted to the selected transmission channel frequencies are combined to produce an analog frequency domain multiplexed transmission signal. At receiver electronics that receive the analog frequency domain multiplexed transmission signal communicated from the coils array: (iv) the analog frequency domain multiplexed transmission signal is digitized to produce a corresponding digital frequency domain multiplexed transmission signal; and (v) the digital frequency domain multiplexed transmission signal is digitally processed to recover digitized signals corresponding to the magnetic resonance signals received by the plurality of coils.

One advantage resides in a reduced number of components in an apparatus for receiving magnetic resonance signals.

Another advantage resides in shifting the analog-to-digital conversion up-stream in the receive chain, thus reducing the number of analog components and the potential for introduction of noise in the analog portion.

Still yet another advantage resides in ensuring coherence of the plurality of frequency domain multiplexed magnetic resonance signals.

Numerous additional advantages and benefits will become apparent to those of ordinary skill in the art upon reading the following detailed description.

The invention may take form in various components and arrangements of components, and in various process operations and arrangements of process operations. The drawings are only for the purpose of illustrating preferred embodiments and are not to be construed as limiting the invention.

FIG. 1 diagrammatically shows a magnetic resonance imaging system including an improved apparatus for receiving magnetic resonance signals.

Figure 2:
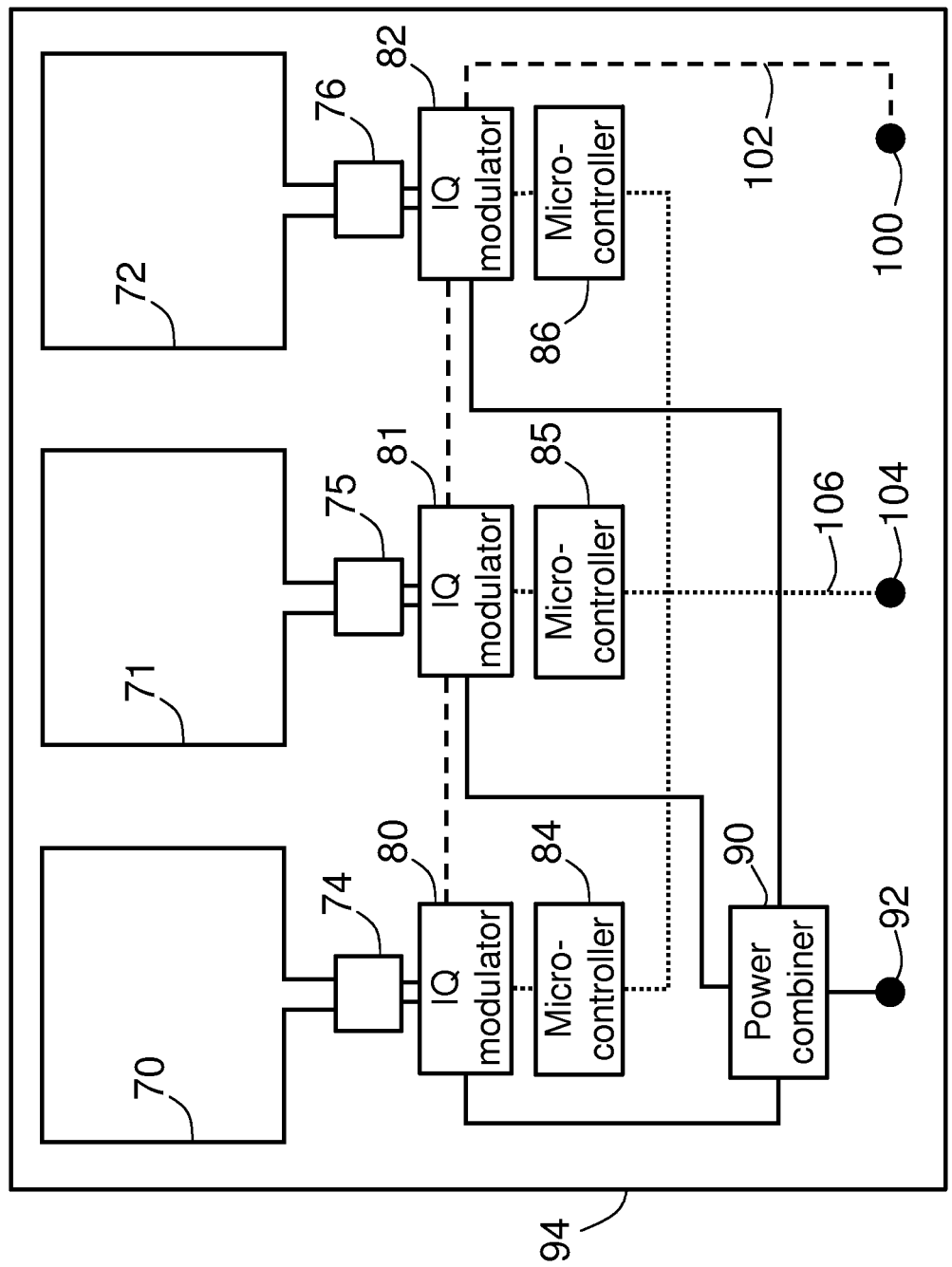

FIG. 2 diagrammatically shows the receive coil array of FIG. 1.

Figure 3:
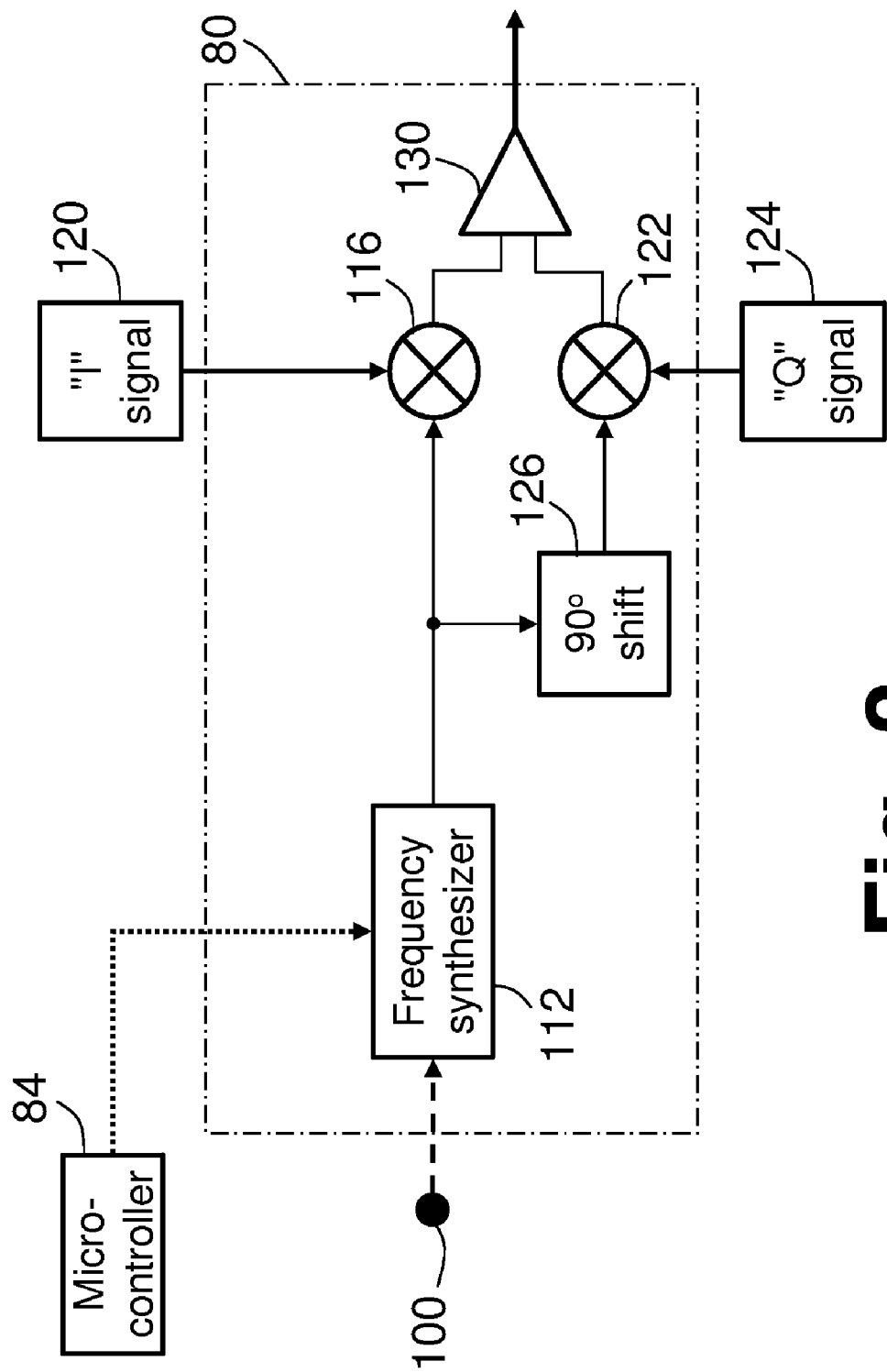

FIG. 3 diagrammatically shows the mixing circuitry associated with one of the coils of the receive coils array of FIG. 1.

Figure 4:
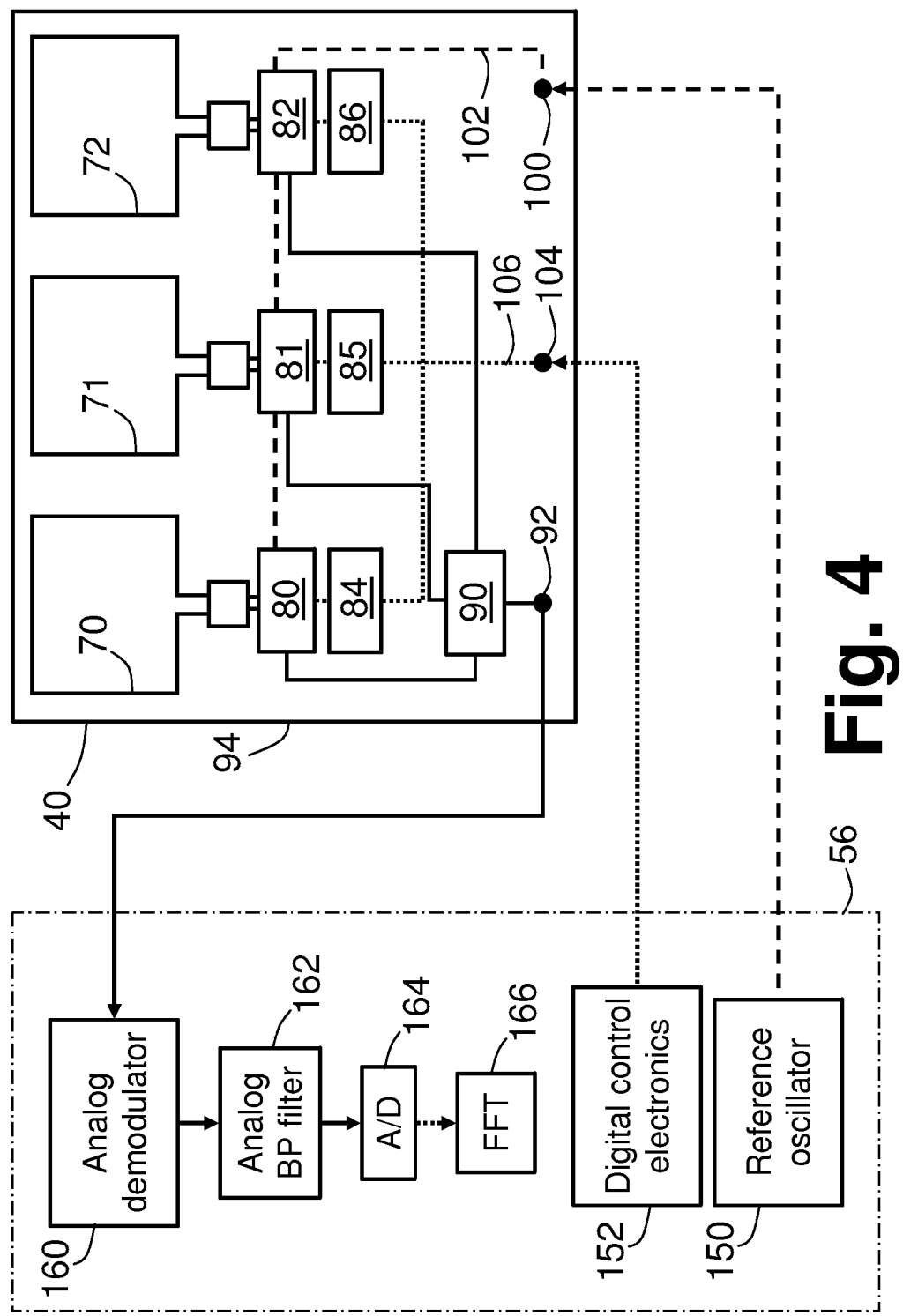

FIG. 4 diagrammatically illustrates details of the improved apparatus for receiving magnetic resonance signals of FIG. 1.

Figure 5:
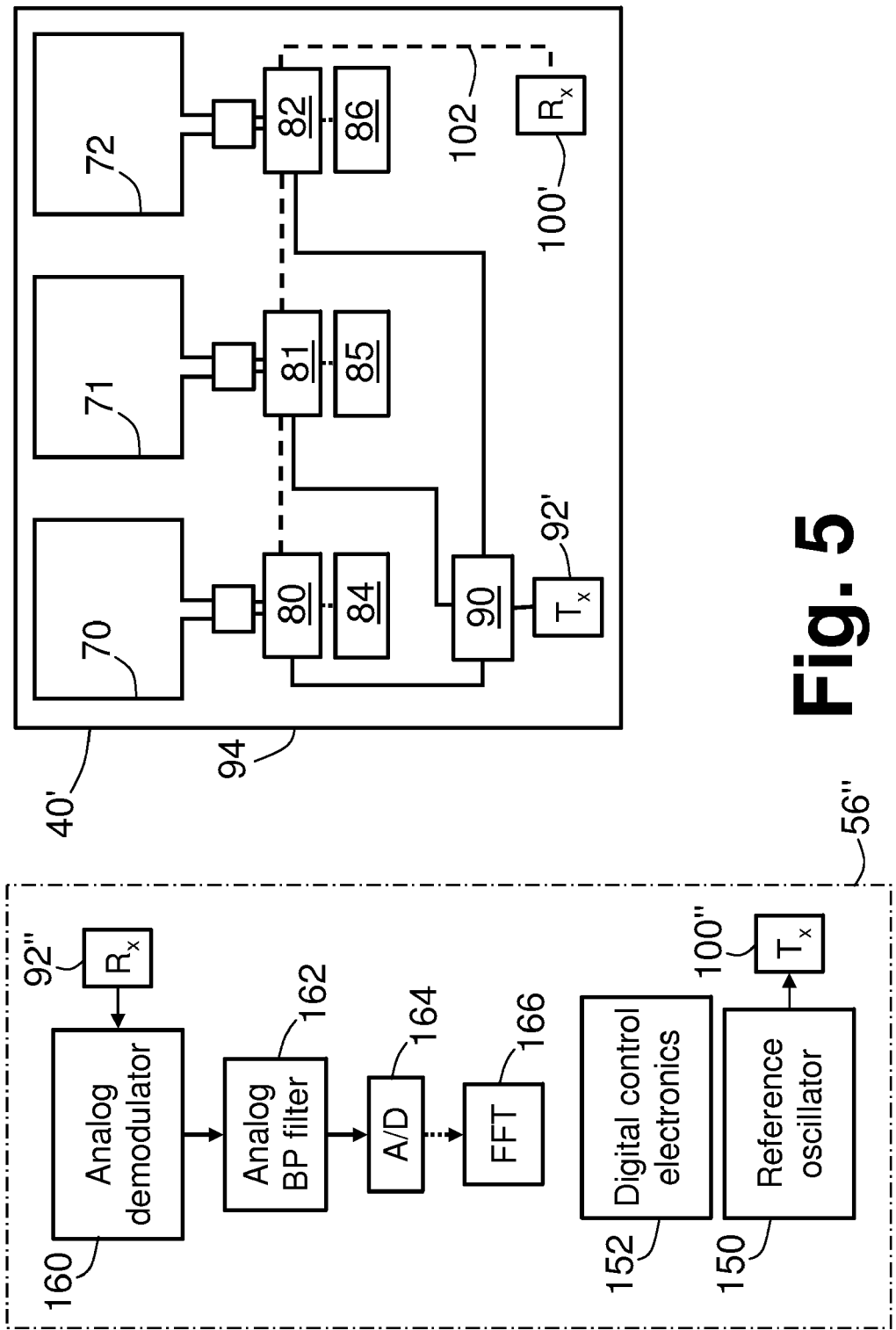

FIG. 5 illustrates another example embodiment of an apparatus for receiving magnetic resonance signals in which the receive coils array is partially or completely wireless.

With reference to FIG. 1, a magnetic resonance imaging scanner 10 includes a housing 12 defining an examination region 14 in which is disposed a patient or other imaging subject 16. A main magnet 20 disposed in the housing 12 generates a main magnetic field in the examination region 14. Typically, the main magnet 20 is a superconducting magnet surrounded by cryoshrouding 24; however, a resistive main magnet can also be used. Magnetic field gradient coils 30 are arranged in or on the housing 12 to superimpose selected magnetic field gradients on the main magnetic field within the examination region. A means is also provided for injecting radio frequency excitation pulses into the examination region. In the illustrated embodiment, a whole-body radio frequency coil 32, such as a birdcage coil, is arranged in or on the housing 12 to inject radio frequency excitation pulses into the examination region. In other embodiments, a head coil, arm or leg coil, surface coil, or other type of coil is used to inject the radio frequency excitation pulses. A cosmetic liner 36 optionally lines the bore 14. A magnetic field receive coils array 40 is disposed inside the bore 14 in the main magnetic field close to the imaging region to receive generated magnetic resonance signals. Although a separate transmit coil 32 and receive coils array 40 are illustrated, in some embodiments the receive coils array 40 also serves as a transmit coil to inject radio frequency excitation pulses into the examination region.

With continuing reference to FIG. 1, a magnetic resonance imaging controller 50 operates magnetic field gradient controllers 52 coupled to the gradient coils 30 to superimpose selected magnetic field gradients on the main magnetic field in the examination region, and also operates a radio frequency transmitter 54 coupled to the transmit coil 32 to inject selected radio frequency excitation pulses at about the magnetic resonance frequency into the examination region. The radio frequency excitation pulses excite magnetic resonance signals in the imaging subject 16 that are spatially encoded by the selected magnetic field gradients. Still further, the imaging controller 50 operates a radio frequency receiver 56 connected with the magnetic field receive coils array 40 to receive the generated and spatially encoded magnetic resonance signals, and the received magnetic resonance data is stored in a magnetic resonance data memory 60.

A reconstruction processor 62 reconstructs the stored magnetic resonance data into a reconstructed image of the imaging subject 16 or a selected portion thereof. The reconstruction processor 62 suitably employs a Fourier transform reconstruction technique or other suitable reconstruction technique that comports with the spatial encoding used in the data acquisition. The reconstructed image is stored in an images memory 64, and can be displayed on a user interface 66, transmitted over a local area network or the Internet, printed by a printer, or otherwise utilized. In the illustrated embodiment, the user interface 66 also enables a radiologist or other user to interface with the imaging controller 50 to select, modify, or execute imaging sequences. In other embodiments, separate user interfaces are provided for operating the scanner 10 and for displaying or otherwise manipulating the reconstructed images.

The described magnetic resonance imaging system is an illustrative example. In general, substantially any magnetic resonance imaging scanner can incorporate the disclosed methods and apparatuses for connecting receive coils. For example, the scanner can be an open magnet scanner, a vertical bore scanner, a low-field scanner, a high-field scanner, or so forth. Moreover, the receive coils are in some embodiments also used for injecting radio frequency excitation pulses—in such embodiments the separate transmit coil 32 is optionally omitted.

With reference to FIG. 2, the magnetic field receive coils array 40 includes a plurality of coils 70, 71, 72. Three coils are included in the example coils array 40 for illustrative purposes; however, typically a larger number of coils are included, such four, eight, ten, twenty, thirty-two, or another number of coils. Although not illustrated, each of the plurality of coils 70, 71, 72 typically includes associated coil circuitry such as preamplification circuitry, decoupling circuitry for decoupling the coil during the transmit phase of the magnetic resonance sequence, or so forth.

Each coil further includes mixing circuitry that frequency-shifts the magnetic resonance signal received by the coil to a selected transmission channel frequency. In the illustrated embodiment, each of the coils 70, 71, 72 has a corresponding quadrature power divider 74, 75, 76 that splits the received and preamplified magnetic resonance signal into a first part designated the "I" signal, and a second part designated the "Q" signal having the same amplitude but a 90° phase shift versus the "I" signal. Alternatively the coil can include two windings at right angles to each other, one feeding the I signal and the second one the Q signal, correspondingly, to the modulator. In this way the system will detect a rotating magnetic resonance signal rather than a linear one: This usually improves on the system signal to noise performance. For a simple linear coil, such as indicated in the Figure, a simpler way is to leave out the power splitter and not use the Q input. Each of the coils 70, 71, 72 further has a corresponding heterodyning mixer or modulator 80, 81, 82 that receives the "I" and "Q" signals and generates a frequency-shifted output signal at a selected transmission channel frequency. Each of the coils 70, 71, 72 has a different selected transmission channel frequency. Microprocessors or microcontrollers 84, 85, 86 are used to control operation of the heterodyning mixers or modulators 80, 81, 82, such as selection of the transmission channel frequency of each modulator. Although in FIG. 2 a separate microcontroller 84, 85, 86 is illustrated for controlling each of the modulators 80, 81, 82, it is also contemplated to use a single microprocessor or microcontroller suitably configured to control all the modulators of the coils array 40.

Power combiner circuitry 90 combines the frequency-shifted magnetic resonance signals output by the modulators 80, 81, 82 to produce an analog frequency domain multiplexed (FDM) transmission signal that is accessible via a port 92 of the coils array 40. The illustrated coils array 40 is constructed on a printed circuit board 94. In this illustrated example embodiment, the coils 70, 71, 72 are suitably formed as copper traces disposed on the printed circuit board 94, and the various coils array components 74, 75, 76, 80, 81, 82, 84, 85, 86, 90 are suitably integrated circuit components mounted on the printed circuit board 94. In other embodiments, the coils may be stand-alone conductive loops, transmission lines, or other components suitably configured to receive magnetic resonance signals. Moreover, while the coils array 40 is diagrammatically illustrated without a housing, it is to be appreciated that typically the coils array will be housed in a cosmetic housing. Still further, the various coils array components 74, 75, 76, 80, 81, 82, 84, 85, 86, 90 are optionally shielded.

To ensure coherency of the magnetic resonance signals carried by the analog frequency domain multiplexed signal, the modulators 80, 81, 82 should employ coherent modulation frequencies. A reference oscillator signal is received at a port 100 of the coils array 40, and is fed to the modulators 80, 81, 82 via printed circuitry 102 of the printed circuit board 94. The printed circuitry 102 distributing the reference oscillator signal is drawn with dashed lines in FIG. 2. Moreover, to enable external control of the coils array 40, for example to activate and deactivate coil decoupling, to externally select modulation frequencies for the frequency domain multiplexing, and so forth, a digital input port 104 is also optionally provided, and optional digital circuitry 106 (shown by dotted lines in FIG. 2) of the printed circuit board 94 distributes digital control signals to microcontrollers 84, 85, 86 or elsewhere on the coils array 40.

With reference to FIG. 3, a suitable embodiment of the modulator 80 is illustrated. The reference oscillator signal received at the input port 100 is fed to a frequency synthesizer 112, which generates a signal at a frequency which is equal to the reference value multiplied by a selected factor, which does not have to be an integral number. To perform quadrature mixing, a first mixer 116 mixes the "I" signal 120 output by the quadrature power divider 74 with the modulation signal, while a second mixer 122 mixes the "Q" signal 124 output by the quadrature power divider 74 with the modulation signal phase-shifted 90° by a phase shifter 126. A signal combiner 130 combines the outputs of the mixers 116, 122 to output the magnetic resonance signal frequency-shifted to a transmission channel frequency selected by the multiple factor of the frequency synthesizer 112.

FIG. 3 illustrates the modulator 80; it is to be appreciated that the other modulators 81, 82 of the coils array 40 can be analogously constructed. The modulation frequency for each of the plurality of coils 70, 71, 72 of the coils array 40 should be different so that the magnetic resonance signal received by each coil is frequency domain multiplexed to a different transmission channel. Because the frequency synthesizers maintain mutual coherence through the use of the reference oscillator signal received at the input port 100, the frequency spacing between adjacent transmission channels can be relatively small, as long as the bandwidth of the magnetic resonance signal is accommodated by each transmission channel. In some embodiments, the selected transmission channel frequencies are spaced apart by frequency intervals of between about 0.5 MHz and about 1.0 MHz.

In some embodiments, the modulators 80, 81, 82 are each embodied by a Maxim MAX2150 wideband IQ modulator with built-in Sigma-Delta Fractional-N synthesizer (available from Maxim Integrated Products, Sunnyvale Calif.). The frequency synthesizer of the MAX2150 is programmable to select the frequency of the modulation signal, and hence to select the transmission channel frequency. In some embodiments, the reference oscillator signal has a frequency of 40 MHz, and the synthesized modulation signal frequencies are spaced apart by 0.5 MHz to 1.0 MHz intervals at around 1 GHz. As a specific example, if the scanner 10 is operating at 1 Tesla corresponding to a magnetic resonance frequency of 42 MHz, and there are 32 channels, the following is one example of suitable frequency domain multiplexing. The transmission channel frequencies are selected at 1 MHz spacings as 1001 MHz, 1002 MHz, . . . 1032 MHz for the 32 channels. The frequency synthesizers of the MAX2150 IQ modulators are selected to be 42 MHz below these values, assuming that the upper side band is utilized, so that the synthesized modulation signal frequencies are 959 MHz, 960 MHz, . . . 990 MHz.

With reference to FIG. 4, a suitable embodiment of the radio frequency receiver 56 is described. The receiver 56 includes a reference oscillator 150 that outputs the reference oscillator signal that is transmitted to the input port 100 of the coils array 40. Digital control electronics 152 transmit control signals to the digital input port 104 of the coils array 40. The control signals may include, for example, signals to activate the decouplers of the coils 70, 71, 72 during the transmit phase of the magnetic resonance sequence, programming of the frequency multiple values of the modulators 80, 81, 82 to set the transmission channel frequencies, or so forth. The digital control electronics 152 communicate with the microcontrollers 84, 85, 86, which in turn control the coils array 40 to effectuate the selected action or setting. Advantageously, if the number of coils in the coils array 40 is increased by adding additional coils, these additional coils are readily accommodated by having the digital control electronics 152 assign suitable transmission channel frequencies for those added coils.

The analog frequency domain multiplexed output signal present at the port 92 is communicated to an analog demodulator 160 of the radio frequency receiver 56 by a suitable coaxial cable. The analog demodulator 160 frequency shifts or down-converts the analog frequency domain multiplexed signal to a lower frequency suitable for accurate analog-to-digital processing. To reduce the effect of 1/f-type noise, the analog demodulator 160 preferably does not down-convert the analog frequency domain multiplexed signal too close to zero; on the other hand, as the output frequency of the analog demodulator 160 increases, higher speed analog-to-digital conversion circuitry will be required. In some embodiments, as described above, the analog frequency domain multiplexed signal is between about 1000 MHz and 1032 MHz. The analog demodulator 160 down-converts the analog frequency domain multiplexed signal to between about 10 MHz to 42 MHz.

In some embodiments, the reference oscillator 150 and the analog demodulator 160 are embodied by a Maxim MAX2118 direct conversion tuner integrated circuit with monolithic voltage-controlled oscillator (available from Maxim Integrated Products, Sunnyvale Calif.). The built-in voltage-controlled oscillator of the MAX2118 suitably provides the reference oscillator signal.

An analog bandpass filter 162 isolates the analog frequency domain multiplexed signal at the down-converted center frequency. The filter 162 has a passband that at least encompasses the bandwidth of the analog frequency domain multiplexed signal. If the upper side band is utilized, the analog bandpass filter 162 suitably removes the lower side band as well as other spurious frequencies introduced by the frequency domain multiplexing. Optionally, such analog filtering can be done at the coils array 40 instead of or in addition to analog filtering at the receiver 56. Because the bandpass filter 162 has a relatively wide passband encompassing the frequency channels of the analog frequency domain multiplexed signal, the filter 162 can have a lower quality factor than would be required for a bank of analog filters used to isolate individual transmission channels of the analog frequency domain multiplexed signal.

An analog-to-digital converter 164 digitizes the analog filtered analog frequency domain multiplexed signal. Suitable digital signal processing is then employed to recover digitized signals corresponding to the magnetic resonance signals received by the plurality of coils 70, 71, 72. In one suitable approach, the digital signal processing circuitry includes a fast Fourier transform (FFT) 166; however, other types of digital signal processing can be employed, including a bank of digital filters each tuned to one of the transmission channel frequencies.

In yet another approach the analog demodulator is omitted. This is feasible if the analog frequency domain is selected to be low enough for available converters to handle. The converters can work with signals at higher frequencies than the sampling frequency; in this mode they perform both mixing and conversion. They will then fold signals that differ by multiples of half of the converter frequency but the analog and pass filter gets rid of the unwanted ones, including noise. Selecting a domain e.g. between 350 and 400 MHz, a converter model MAX 1213 manufactured by MAXIM can be used.

With reference to FIG. 5, a wireless coils array 40' is wirelessly connected with a modified radio frequency receiver 56". The coils array 40' is similar to the coils array 40, except that: (i) the reference oscillator signal input port 100 of the coils array 40 is replaced in the coils array 40' by a wireless receiver component 100'; (ii) the output port 92 of the coils array 40 is replaced by a wireless transmitter component 92'; and (iii) the digital input port 104 of the coils array 40 is omitted, and the multiplier values defining the modulation frequencies are set on the coils array 40' by being hardcoded into the programming of the microcontrollers 84, 85, 86, or by being set by DIP switches (not shown), or by being set in another way. In other embodiments, digital control signals are frequency domain multiplexed onto the signal received by the wireless receiver 100', and the multiplexed digital control signals and reference oscillator signal are separated by filtering at the coils array 40'.

The modified radio frequency receiver 56" of FIG. 5 is similar to the radio frequency receiver 56, except that: (i) a radio frequency transmitter component 100" is added to generate the transmission of the reference oscillator signal received by the wireless receiver component 100' of the coils array 40'; and (ii) a wireless receiver component 92" is added to receive the wireless transmission of the analog frequency domain multiplexed signal output by the wireless transmitter component 92' of the coils array 40'. With these modifications, the coils array 40' can be partially wireless (except for a power cable) or completely wireless (if an on-board battery is added to the coils array 40').

The invention has been described with reference to the preferred embodiments. Obviously, modifications and alterations will occur to others upon reading and understanding the preceding detailed description. It is intended that the invention be construed as including all such modifications and alterations insofar as they come within the scope of the appended claims or the equivalents thereof.

The invention claimed is:

1. An apparatus for receiving magnetic resonance signals, the apparatus comprising:
    a coils array including a plurality of coils adapted to be positioned to receive magnetic resonance signals emanating from an examination region of an associated magnetic resonance imaging scanner, each coil having corresponding mixing circuitry that frequency shifts the magnetic resonance signal received by the coil to a selected transmission channel frequency, the coils array further including combining circuitry that combines the frequency shifted magnetic resonance signals to produce an analog frequency domain multiplexed transmission signal output of the coils array; and
    receiver electronics that receive the analog frequency domain multiplexed transmission signal from the coils array, the receiver electronics including an analog to digital converter that digitizes the analog frequency domain multiplexed transmission signal to produce a corresponding digital frequency domain multiplexed transmission signal and digital signal processing circuitry that processes the digital frequency domain multiplexed transmission signal to recover digitized signals corresponding to the magnetic resonance signals received by the plurality of coils.

2. The apparatus as set forth in claim 1, wherein the mixing circuitry of each coil includes:
    a frequency synthesizer, the frequency shifting being performed by mixing the magnetic resonance signal with an output of the frequency synthesizer.

3. The apparatus as set forth in claim 2, wherein the receiver electronics further include:
    a reference oscillator outputting a reference oscillator signal that is communicated to the plurality of frequency synthesizers to maintain coherence between the frequency synthesizers.

4. The apparatus as set forth in claim 3, wherein the frequency synthesizer of each coil outputs a selected multiple of the reference oscillator signal, the selected multiple being different for each coil.

5. The apparatus as set forth in claim 4, wherein the coils array further includes:
    one or more microcontrollers that set the selected multiple for each frequency synthesizer.

6. The apparatus as set forth in claim 5, wherein the receiver electronics further include:
    digital control circuitry communicating with the one or more microcontrollers to program the selected multiple for each of the plurality of coils.

7. The apparatus as set forth in claim 3, wherein the selected transmission channel frequencies are spaced apart by frequency intervals of between about 0.5 MHz and about 1.0 MHz.

8. The apparatus as set forth in claim 3, wherein the mixing circuitry of each coil further includes:
- a quadrature divider that divides the magnetic resonance signal received by the coil into an "I" signal and a "Q" signal; and
- circuitry that mixes the "I" and "Q" signals with the output of the frequency synthesizer and the output of the frequency synthesizer shifted by 90°, respectively, and combines the mixed signals to produce the frequency shifted magnetic resonance signal.

9. The apparatus as set forth in claim 3, wherein the digital signal processing circuitry of the receiver electronics includes:
- fast Fourier transform circuitry that generates a fast Fourier transform of the digital frequency domain multiplexed transmission signal.

10. An for receiving magnetic resonance signals, the apparatus comprising:
- a coils array including a plurality of coils adapted to be positioned to receive magnetic resonance signals emanating from an examination region of an associated magnetic resonance imaging scanner, each coil having corresponding mixing circuitry that frequency shifts the magnetic resonance signal received by the coil to a selected transmission channel frequency, wherein the mixing circuitry of each coil includes a frequency synthesizer, the frequency shifting being performed by mixing the magnetic resonance signal with an output of the frequency synthesizer, the coils array further including combining circuitry that combines the frequency shifted magnetic resonance signals to produce an analog frequency domain multiplexed transmission signal output of the coils array; and
- receiver electronics that receive the analog frequency domain multiplexed transmission signal from the coils array, the receiver electronics including an analog to digital converter that digitizes the analog frequency domain multiplexed transmission signal to produce a corresponding digital frequency domain multiplexed transmission signal and digital signal processing circuitry that processes the digital frequency domain multiplexed transmission signal to recover digitized signals corresponding to the magnetic resonance signals received by the plurality of coils, wherein the digital signal processing circuitry of the receiver electronics includes a bank of digital filters each tuned to one of the transmission channel frequencies of the digital frequency domain multiplexed transmission signal, the receiver electronics further including a reference oscillator outputting a reference oscillator signal that is communicated to the plurality of frequency synthesizers to maintain coherence between the frequency synthesizers.

11. The apparatus as set forth in claim 3, wherein the receiver electronics further include:
- an analog bandpass filter preceding the analog to digital converter, the bandpass filter having a passband including at least the transmission channel frequencies of the analog frequency domain multiplexed transmission signal.

12. The apparatus as set forth in claim 3, wherein the receiver electronics further include:
- a demodulator that down converts the analog frequency domain multiplexed transmission signal to a lower frequency suitable for input to the analog to digital converter.

13. The apparatus as set forth in claim 3, wherein:
the receiver electronics further include:
- (i) a wireless transmitter that wirelessly transmits the reference oscillator signal, and
- (ii) a wireless receiver that receives a wireless transmission of the analog frequency domain multiplexed transmission signal; and the coils array further includes:
- (i) a wireless receiver that receives the wireless transmission of the reference oscillator signal, and
- (ii) a wireless transmitter that wirelessly transmits the analog frequency domain multiplexed transmission signal.

14. A magnetic resonance imaging system comprising:
- a main magnet for generating a main magnetic field in an examination region;
- gradient coils for superimposing selected magnetic field gradients on the main magnetic field;
- a means for injecting radio frequency excitation pulses into the examination region; and
- an apparatus for receiving magnetic resonance signals as set forth in claim 1.

15. A method for receiving magnetic resonance signals, the method comprising:
- at a coils array positioned to receive magnetic resonance signals emanating from an examination region of an associated magnetic resonance imaging scanner:
  - (i) receiving magnetic resonance signals with a plurality of coils,
  - (ii) frequency shifting the magnetic resonance signal received by each coil to a selected transmission channel frequency, and
  - (iii) combining the magnetic resonance signals frequency shifted to the selected transmission channel frequencies to produce an analog frequency domain multiplexed transmission signal; and
- at receiver electronics that receive the analog frequency domain multiplexed transmission signal communicated from the coils array:
  - (iv) digitizing the analog frequency domain multiplexed transmission signal to produce a corresponding digital frequency domain multiplexed transmission signal, and
  - (v) digitally processing the digital frequency domain multiplexed transmission signal to recover digitized signals corresponding to the magnetic resonance signals received by the plurality of coils.

16. The method as set forth in claim 15, further including:
synthesizing a modulation frequency for each coil at the coils array, the frequency shifting being performed by mixing the magnetic resonance signal with the modulation frequency.

17. The method as set forth in claim 16, further including:
generating a reference oscillator signal at the receiver electronics; and
communicating the reference oscillator signal to the coils array, the synthesizing employing the reference oscillator signal to maintain coherence between the synthesized modulation frequencies of the plurality of coils.

18. The method as set forth in claim 17, wherein the synthesizing of each modulation frequency includes:
generating a selected multiple of the reference oscillator signal.

19. The method as set forth in claim 15, wherein the selected transmission channel frequencies are spaced apart by frequency intervals of between about 0.5 MHz and about 1.0 MHz.

20. The method as set forth in claim 15, wherein the digital processing includes:
Fourier transforming the digital frequency domain multiplexed transmission signal.

21. The method as set forth in claim 15, further including:
wirelessly transmitting the reference oscillator signal from the receiver electronics to the coils array; and
wirelessly transmitting the analog frequency domain multiplexed transmission signal from the coils array to the receiver electronics.

22. A magnetic resonance imaging apparatus for performing the method of claim 15.

* * * * *